United States Patent
Iguchi et al.

(10) Patent No.: US 9,929,367 B2
(45) Date of Patent: Mar. 27, 2018

(54) DISPLAY DEVICE AND METHOD FOR FABRICATING THE SAME

(71) Applicant: BOE TECHNOLOGY GROUP CO., LTD., Beijing (CN)

(72) Inventors: Shinsuke Iguchi, Beijing (CN); Chinlung Liao, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 190 days.

(21) Appl. No.: 14/681,287

(22) Filed: Apr. 8, 2015

(65) Prior Publication Data

US 2016/0285028 A1    Sep. 29, 2016

(30) Foreign Application Priority Data

Mar. 26, 2015 (CN) .......................... 2015 1 0135434

(51) Int. Cl.
*H01L 51/50* (2006.01)
(52) U.S. Cl.
CPC ................ *H01L 51/5088* (2013.01)
(58) Field of Classification Search
CPC ............ H01L 2251/568; H01L 51/525; H01L 51/5088; H01L 51/56; H01L 27/3246; H01L 51/0005; G02B 5/201; G02B 5/223; G02F 1/133516
USPC .......................................................... 438/35
See application file for complete search history.

(56) References Cited

U.S. PATENT DOCUMENTS

| | | | |
|---|---|---|---|
| 2004/0160187 A1* | 8/2004 | Yao | H01J 9/185 313/609 |
| 2004/0201048 A1* | 10/2004 | Seki | G02B 5/201 257/294 |
| 2005/0190253 A1* | 9/2005 | Duineveld | H01L 51/52 347/106 |

(Continued)

FOREIGN PATENT DOCUMENTS

| | | |
|---|---|---|
| CN | 1658050 | 8/2005 |
| CN | 1756605 | 4/2006 |

(Continued)

OTHER PUBLICATIONS

Machine Translation of CN 102236208 (Beijing BOE Optoelectronics) Nov. 9, 2011, 10 pages.*

(Continued)

*Primary Examiner* — Caridad Everhart
(74) *Attorney, Agent, or Firm* — Calfee, Halter & Griswold LLP (57) ABSTRACT

The present invention relates to the field of display technology, and particularly to a display device and method for fabricating the same. The display device comprises: a substrate; one or more dams which are arranged to surround an active area on the substrate; and a functional film formed in the active area. A method for fabricating a display device comprises: forming one or more dams on a substrate which surround a region to be coated; coating a functional ink in the region to be coated; and forming the functional ink into a functional film. According to the present invention, the dams prevent the functional ink from spreading to a peripheral region of the substrate, which facilitates forming a functional film with a uniform thickness and reduces the consumption of the functional ink.

11 Claims, 6 Drawing Sheets

(56) References Cited

U.S. PATENT DOCUMENTS

| | | | |
|---|---|---|---|
| 2006/0096528 A1* | 5/2006 | Kawatake | B05C 5/0262 118/407 |
| 2007/0200147 A1* | 8/2007 | Ohtani | B05C 5/0254 257/211 |
| 2008/0212009 A1* | 9/2008 | Nakano | G02F 1/13439 349/141 |
| 2010/0181554 A1* | 7/2010 | Yoshida | H01L 51/5209 257/40 |
| 2011/0254003 A1* | 10/2011 | Tsuzuki | H01L 51/0005 257/57 |
| 2011/0261477 A1* | 10/2011 | Okumoto | G02B 5/201 359/886 |
| 2011/0287682 A1* | 11/2011 | Miyazawa | H01L 27/3246 445/2 |
| 2012/0012834 A1* | 1/2012 | Sonoda | G02B 5/201 257/40 |
| 2012/0181512 A1* | 7/2012 | Puntambekar | H01L 51/0012 257/40 |

FOREIGN PATENT DOCUMENTS

| | | | |
|---|---|---|---|
| CN | 1904699 | 1/2007 | |
| CN | 101002113 | 7/2007 | |
| CN | 102236208 | 11/2011 | |
| CN | 102236208 A | * 11/2011 | G02F 1/1337 |
| CN | 204479887 | 7/2015 | |
| JP | 2007087693 | 4/2007 | |

OTHER PUBLICATIONS

Machine Translation of CN 1904699 (Zhonghua Picture Tube Co., Ltd.) Jan. 31, 2007, 7 pages.*
Machine Translation of CN102236208A (Jin et al) (Nov. 9, 2011) 10 pages.*
Office Action from China Application No. 201510135434.7 dated Feb. 22, 2017.
Second Office Action for Chinese Patent Application No. 201510135434.7 dated Sep. 13, 2017.

* cited by examiner

Fig. 10 ated herein
DISPLAY DEVICE AND METHOD FOR FABRICATING THE SAME

RELATED APPLICATION(S)

The present application claims the benefit of Chinese Patent Application No. 201510135434.7, filed Mar. 26, 2015, the entire disclosure of which is incorporated herein by reference.

FIELD OF THE INVENTION

The present invention relates to the field of display technology, and particularly to a display device and a method for fabricating the same.

BACKGROUND ART

In display devices such as an organic electroluminescence display device and a liquid crystal display device, methods like sputtering, evaporation, or CVD are generally applied to form an organic or inorganic functional film. Recently, various functional films can be formed by coating. Particularly, a hole injection layer (HIL) in the organic electroluminescence display device and an alignment film (e.g., a polyimide alignment film) in the liquid crystal display device are usually coated via a die slit coater (DSC), an inkjet printer (IJP), or the like.

Since a thickness of the coated functional film greatly influences the function of the display device, a good solvent is usually adopted in which a functional material (a precursor for the functional film) dissolves easily, so as to uniformly form a functional film on a substrate. Besides, to improve wetting property of the solvent on the substrate surface and impart the dried functional film a uniform profile, a poor solvent is further applied so that the coated functional film has a uniform thickness.

A die slit coater DSC shown in FIG. 1, an inkjet printer IJP with a piezoelectric element shown in FIG. 2, and an electric spray coater ESC shown in FIG. 3 are usually applied to form a functional film by coating.

Figure 1A:
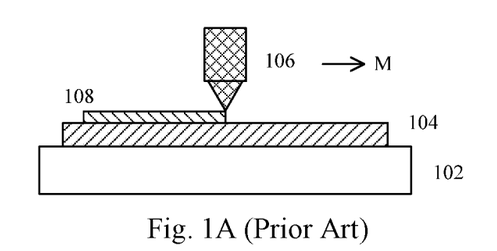
Figure 1B:
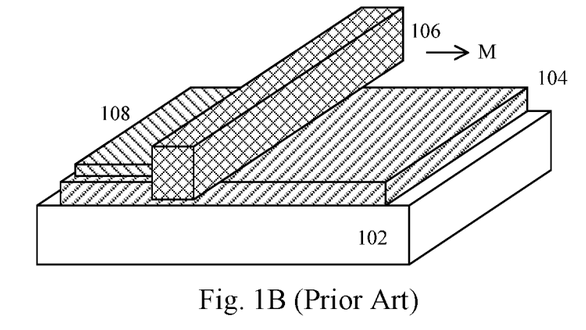
Figure 1C:
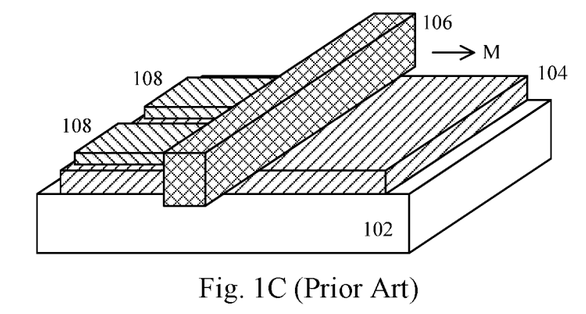

FIGS. 1A, 1B, and 1C are schematic views for illustrating how to coat a functional film on a substrate by a die slit coater DSC. A substrate 104 is fixed to a submount 102. A coating component 106 advances in a direction indicated by an arrow M, and coats an ink comprising a functional material onto the substrate 104. After being dried, the functional ink 108 forms a functional film 108 on a surface of the substrate 104. It is noted that in this context, the functional ink and the functional film made from it share the same or similar reference numerals for simplicity.

Figure 2A:
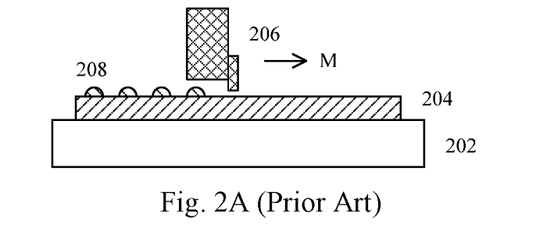
Figure 2B:
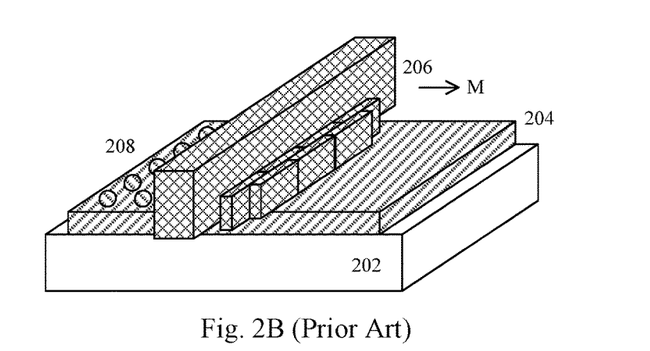

FIGS. 2A and 2B are schematic views for illustrating how to coat a functional film on a substrate by an inkjet printer IJP. A substrate 204 is fixed to a submount 202. A coating component 206 advances in a direction indicated by an arrow M, and prints an ink comprising a functional material onto the substrate 204. The ink spreads to form a film, and once being dried, forms a functional film 208 on a surface of the substrate 204.

Figure 3A:
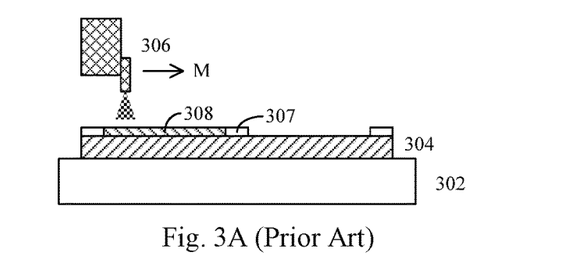
Figure 3B:
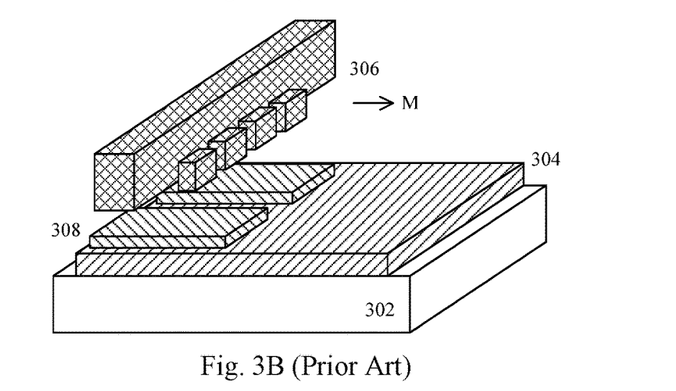

FIGS. 3A and 3B are schematic views for illustrating how to coat a functional film on a substrate by electric spray coater ESC. A substrate 304 is fixed to a submount 302. A coating component 306 advances in a direction indicated by an arrow M, and coats charged particles of a functional material on the substrate 304. The charged particles form a film in a region delimited by a boundary 307, and once being dried, form a functional film 308 on a surface of the substrate 304.

Unfortunately, an expensive functional ink is required in these coating apparatuses. To reduce the consumption of ink, it is desired to only coat in the required portions.

By coating with an inkjet printer IJP in an on-demand manner, it is not only possible to specify a region to be coated, but also to coat only in the region to be coated. By using a split-type die slit coater DSC in which the slit width is divided shown in FIG. 1C, coating can at least partially be performed in the on-demand manner. An electric spray coater ESC which uses a mask for delimiting a region to be coated will be available in the near future.

Figure 4A:
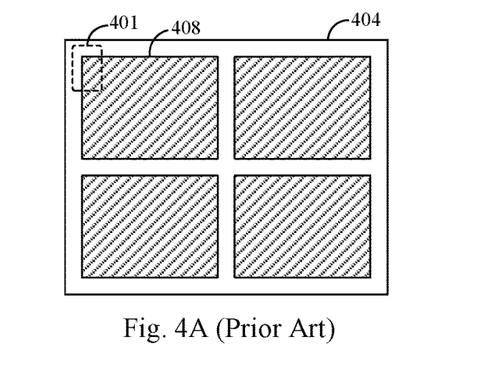
FIG. 4A, 4B, 4C are schematic top views for illustrating spreading of a functional ink coated by a die slit coater in the prior art.
Figure 4B:
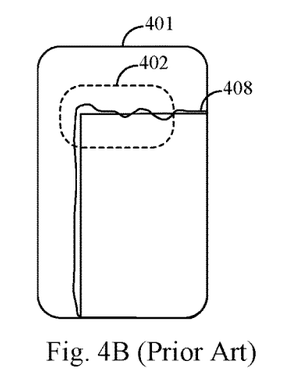
Figure 4C:
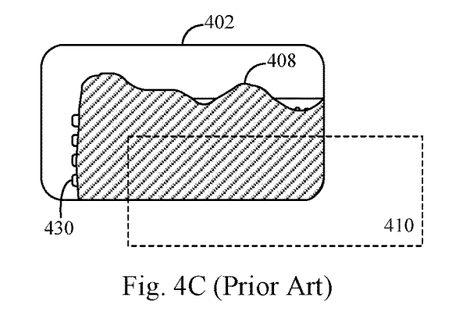

On one hand, in view of the function of the display device, a peripheral bezel region outside the active area is becoming smaller and smaller. On the other hand, narrow bezel display devices become increasingly popular in recent years. FIG. 4A is a top view for illustrating a substrate 404 on which a functional film 408 has been coated, FIG. 4B is an enlarged view for illustrating a corner portion 401 in FIG. 4A, and FIG. 4C is an enlarged view for illustrating a corner portion 402 in FIG. 4B. As shown in FIGS. 4A-4C, a functional ink 408 coated on such narrow bezel display devices starts to spread from a portion with relatively good wetting property on the substrate 404, and spreads in a flat manner to form an irregular spreading front. Since the coated functional ink does not spread uniformly on the substrate 404, so that the finally formed functional film has a non-uniform thickness, leading to defects like mura in light emitting in the finished display device. Besides, apart from the active area 410, the functional ink 408 may further cover contact holes 430 in the peripheral region. It was proposed to remove the functional film formed by the functional ink 408 which spreads to undesired regions by plasma or laser. However, in this case, sublimation during removal by plasma or laser may affect functional components in the display device, making it not the best way to remove the functional film.

There is a need for an improved display device and a method for fabricating the same in the art.

SUMMARY

The present invention aims to at least partially alleviate or solve the problems as mentioned above.

According to embodiments of the present invention, dams are arranged in a peripheral region of the substrate of the display device, so that when a functional film is formed on the substrate, the coated functional ink is prevented by the dams from spreading to the peripheral region of the substrate, which facilitates forming a functional film with a uniform thickness, reduces the consumption of the functional ink, and thus at least partially alleviate or solve the problems as mentioned above.

In a first aspect of the present invention, there is provided a display device, comprising: a substrate; one or more dams which are arranged to surround an active area on the substrate; and a functional film formed in the active area.

In the display device of the present invention, one or more dams are arranged to surround the active area of the substrate, so that when the functional film is formed by coating, the coated functional ink is prevented by the dams from spreading to the peripheral region of the substrate. This facilitates forming a functional film with a uniform thickness, reducing defects like mura in light emitting due to the functional film (e.g., a light emitting layer) with a non-uniform thickness. During forming the functional film, it is possible to prevent the functional ink from overflowing to undesired portions of the substrate, thus avoiding influences on other components in the display device, and improving the yield of the display device. Since the functional ink is effectively restricted to the specific regions, it is possible to reduce the actual consumption of the functional ink, and further to control the cost of display device. The functional ink is prevented from spreading to undesired portions, so that it is not necessary to remove the functional film in undesired portions by plasma or laser, thus simplifying the process steps. The formed functional film like a light emitting layer has a uniform thickness, which facilitates forming films with uniform thicknesses in subsequent processes, so that the films in the active area uniformly emit light or display images.

According to an embodiment of the present invention, the dams can be lyophobic. Thereby, the dams can effectively prevent adhesion of the functional ink, and block the functional ink from spreading outside.

According to an embodiment of the present invention, the dams can have a height of 0.5 μm-50 μm, preferably 1-10 μm, and more preferably 2 μm, and a width of 50 μm-5000 μm, preferably 100 μm-1000 μm, and more preferably 500 μm. Dams with such height and width are cost effective during fabrication, and effectively block the functional ink from spreading outside. Preferably, each dam can have the same or different height and width.

According to an embodiment of the present invention, at least one of the dams can be continuous and closed. For example, the outermost dam can be continuous and closed so as to effectively block the functional ink from spreading outside during coating.

According to an embodiment of the present invention, the dams can be formed from polyimide resin, acrylic resin, melamine resin, or polysiloxane. For example, the dams can be formed from an organic material which is compatible with the process for fabricating the display device. If thermal resistance is considered, the dams can be formed from an inorganic material.

According to an embodiment of the present invention, as observed from the active area, the dams have a corner portion which can be right-angled, polygon-shaped, R-shaped, or arc-shaped. Thereby, the dams can prevent the functional ink from spreading outside during coating.

According to an embodiment of the present invention, a moat can be formed between the dams or between an outermost dam and the active area. Thereby, the functional ink, which spreads outside from an inner dam during coating, can be accommodated in the moat, so that the functional ink is prevented from spreading outside across the outermost dam.

According to an embodiment of the present invention, the moat may be lyophobic. For example, the moat can be formed from a lyophobic material, or can be subject to surface treatment to be lyophobic. A lyophobic moat can prevent the coated functional ink from spreading outside.

According to an embodiment of the present invention, the moat can have a width of 50 μm-5000 μm. Thereby, the moat can effectively accommodate the functional ink which spreads outside from an inner dam during coating.

According to an embodiment of the present invention, a contact angle of the functional ink against the surface of the dams and the moat can be at least 10 degrees. By reducing the wetting property of the functional ink on the surface of the dam and the moat, the contact angle is improved, which facilitates preventing the functional ink from adhering to the surface of the dam and the moat, and effectively blocks the functional ink from spreading outside.

According to an embodiment of the present invention, a contact angle of the functional ink against the surface of the dams and the moat can be at least 30 degrees. Thereby, as compared with the surface of the dam and the moat, the functional ink tends to concentrate on the surface of an ITO electrode, so as to facilitate forming a functional film with a uniform thickness on the surface of the ITO electrode.

According to an embodiment of the present invention, the display device can be an organic electroluminescence display device or a liquid crystal display device. In case the display device is an organic electroluminescence display device, the functional film can be a light emitting layer in the organic electroluminescence display device, such as the hole transporting layer (HTL). In case the display device is a liquid crystal display device, the functional film can be an alignment layer in the liquid crystal display device.

In a second aspect of the present invention, there is provided a method for fabricating a display device. During forming a functional film in the display device, the method comprises steps of: forming one or more dams on a substrate which surround a region to be coated; coating a functional ink in the region to be coated; and forming the functional ink into a functional film.

According to an embodiment of the present invention, a moat can further be formed between the dams or between an outermost dam and the region to be coated.

According to an embodiment of the present invention, the surface of the dams and the moat can further be treated to be lyophobic.

The method for fabricating a display device in the above embodiments has the same or similar benefits with the display device as mentioned in the corresponding embodiments, which are not repeated herein for simplicity.

According to an embodiment of the present invention, a die slit coater DSC, an inkjet printer IJP, or an electric spray coater ESC can be used to coat the functional ink in the region to be coated.

According to an embodiment of the present invention, when a die slit coater is used to coat the functional ink, a length of a region surrounded by the dams in a coating direction can be larger than a coating length of the die slit coater. Thereby, it is possible to prevent the functional ink from being directly coated on the outermost dam, thus providing margin for spreading of the functional ink.

According to an embodiment of the present invention, when a die slit coater is used to coat the functional ink, in a direction perpendicular to the coating direction, the outermost dam can have a length which is not only larger than a width of the region to be coated but also larger than a width of the slit of the die slit coater. Thereby, it is possible to prevent the functional ink from being directly coated on the outermost dam, thus providing margin for spreading of the functional ink.

According to an embodiment of the present invention, when an electric spray coater is used to coat the functional ink, in a projection along a direction perpendicular to the substrate, the dams can have a length and width larger than a length and width of an opening in a mask used in the electric spray coater respectively. Thereby, it is possible to effectively coat the functional ink coat on the region to be coated which is surrounded by the dam through the mask of the electric spray coater ESC.

According to an embodiment of the present invention, the functional ink can be formed into the functional film by drying and sintering. In this way, a dense and uniform functional film is facilitated.

BRIEF DESCRIPTION OF DRAWINGS

This and other aspects of the present invention will now be described in more detail, with reference to the appended drawings showing currently preferred embodiments of the present invention.

FIGS. 1A, 1B, and 1C are schematic views for illustrating a functional film coated on a substrate by a die slit coater in the prior art respectively, wherein FIG. 1A is a cross-sectional view, and FIGS. 1B and 1C are perspective views;

FIGS. 2A and 2B are schematic views for illustrating a functional film coated on a substrate by an inkjet printer in the prior art respectively, wherein FIG. 2A is a cross-sectional view, and FIG. 2B is a perspective view;

FIGS. 3A and 3B are schematic views for illustrating a functional film coated on a substrate by an electric spray coater in the prior art respectively, wherein FIG. 3A is a cross-sectional view, and FIG. 3B is a perspective view;

The appended drawings are not always drawn to scale. The same reference numerals or reference numerals which differ by integral multiples of 100 are used to indicate the same or similar components throughout the drawings.

DETAILED DESCRIPTION OF EMBODIMENTS

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

In the drawings for all embodiments of the present invention, only structures and/or components relevant with the present inventive concept are schematically indicated, while the irrelevant structures and/or components are partially indicated or completely omitted.

The appended drawings contain the following reference numerals. submount: 102, 202, 302; substrate: 104, 204, 304, 404, 504, 505; coating component: 106, 206, 306, 706, 806, 906; boundary for a region in which a film will be formed: 307; functional film: 108, 208, 308, 408, 608, 708, 808, 908; advancing direction of coating component (coating direction): M; corner portion of substrate coated with functional film: 401, 402; active area: 410, 510, 511; dam: 512A, 512B; dummy area: 520; moat: 521; contact hole: 430, 530, 531; position at which printing starts: 700; slit end of die slit coater DSC: 800.

Figure 5A:
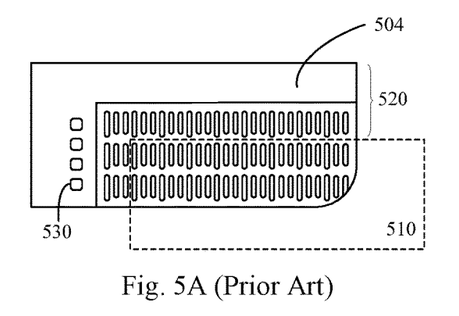
FIG. 5A is a schematic top view for illustrating a corner portion of a substrate in a display device in the prior art.
Figure 5B:
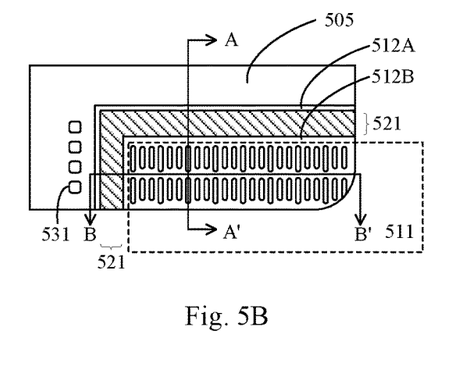
FIG. 5B is a schematic top view for illustrating a corner portion of a substrate in a display device in an embodiment of the present invention.

The present inventive concept will be explained hereinafter by taking forming a hole injection layer in an organic electroluminescence display device as an example. FIG. 5A schematically illustrates a corner portion of a substrate in a display device in the prior art, for comparing with the present invention. As shown in FIG. 5A, the substrate 504 of the organic electroluminescence display device is divided into an active area 510 and a dummy area 520, and contact holes 530 are arranged outside the active area 510. FIG. 5B schematically illustrates a corner portion of a substrate in a display device in an embodiment of the present invention. As shown in FIG. 5B, in an embodiment of the present invention, the substrate of the organic electroluminescence display device is is provided with dams. In particular, dams 512A, 512B are arranged on the substrate 505 to surround the active area 511. Preferably, dams 512A, 512B can be made from a lyophobic material. Alternatively, dams 512A, 512B can be made from non-lyophobic material. Preferably, dams 512A, 512B of a non-lyophobic material can be subject to a lyophobic treatment, so that dams 512A, 512B become lyophobic. Two dams 512A, 512B are schematically illustrated in FIG. 5B. In this case, a moat 521 is formed between the outermost dam 512A and the second outer dam 512B. Alternatively, the substrate 505 can be provided with only one dam 512A, and the moat 521 is formed between the dam 512A and the active area 511. Alternatively, the substrate 505 can be provided with three or more dams.

Figure 6:
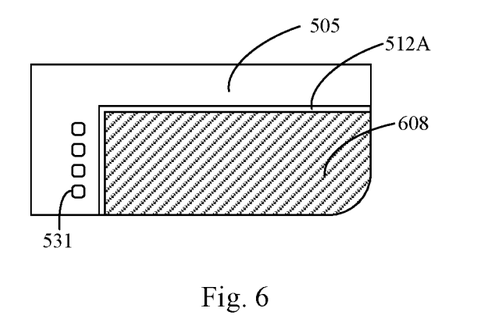
FIG. 6 is a schematic top view for illustrating a corner portion of a substrate on which a functional ink has been coated in an embodiment of the present invention.

When the functional ink is coated on the active area 511 of the substrate 505, dams 512A, 512B with the moat 521 can effectively prevent the functional ink from spreading. For example, as shown in FIG. 6, the coat functional ink spreads and flows into the moat 521. The functional ink is blocked the dam 512A from overflowing to the peripheral region of the substrate 505, thus forming a functional film 608 with a uniform thickness in the active area 511. Firstly, for example, when the functional film 608 is the light emitting layer in the organic electroluminescence display device, the light emitting layer has a uniform thickness, thus reducing mura in light emitting due to a non-uniform thickness. Secondly, the functional ink is blocked by the dam 512A from spreading to the peripheral region of the substrate 505, so that the contact holes 531 will not be affected adversely, and the yield of the organic electroluminescence display device is improved. Thirdly, the functional ink (and the finished functional film 608) can be effectively restricted in the region surrounded by the dams, so that the consumption of the functional ink can be effectively controlled and the cost of the organic electroluminescence display device can be controlled. Fourthly, the functional ink (and the finished functional film 608) is prevented from spreading to undesired portions, so that it is not necessary to remove the functional film in undesired portions by plasma or laser, the process steps are reduced and the process cost is controlled. Fifthly, the formed functional film 608, like a light emitting layer, has a uniform thickness, so that films formed in subsequent processes have uniform thicknesses, and films in the active area uniformly emit light or display images.

Figure 10:
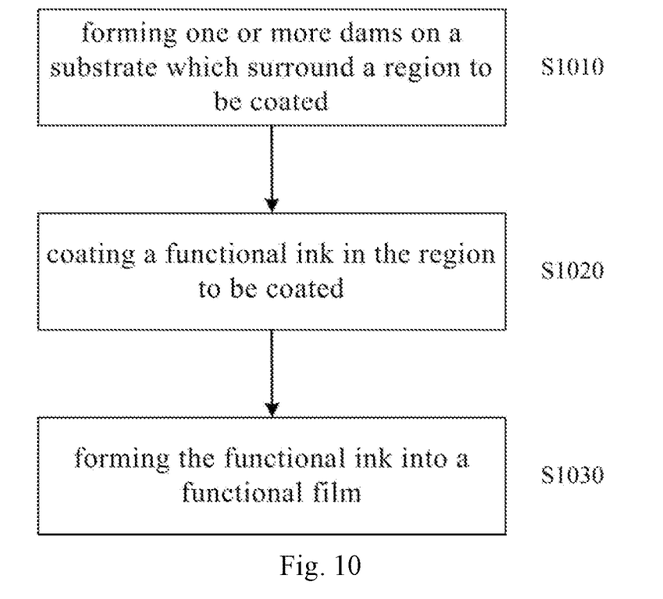
FIG. 10 is a schematic flowchart for illustrating a method for fabricating a display device in an embodiment of the present invention.

FIG. 10 schematically illustrates a flowchart of a method for fabricating a display device in an embodiment of the present invention. As shown, in the present method for fabricating a display device, during forming a functional film in the display device, the method comprises steps of: S1010 forming a dam on a substrate which surrounds a region to be coated; S1020 coating a functional ink in the region to be coated; and S1030 forming the functional ink into a functional film. The steps following the step for forming the functional film is irrelevant with the present inventive concept, and the description thereof is omitted here. In the present invention, it is only required that the step for forming the dam should be performed prior to the step of coating the functional ink.

The method for fabricating an organic electroluminescence display device according to embodiments of the present invention will be described hereinafter by referring to FIGS. 7, 8, and 9.

For example, AN-100 alkali-free glass (available from Asahi Glass Co., Ltd.) is used as the substrate 505. An aluminum film is formed on the substrate 505 by sputtering or the like, and then is formed into wirings by photolithography. The necessary insulating film is formed by coating or the like. After thin-film transistors (TFTs) for driving and ITO transparent electrodes are formed, a polyimide film is formed by coating with a thickness of e.g., 2 µm, and then is formed by photolithography into dams 512A, 512B as shown in FIG. 5B.

Oxygen is then introduced by atmospheric pressure plasma, and an activation treatment is performed against the surface of the ITO electrode via oxygen. Then, carbon tetrafluoride (CF4) is introduced to perforin a fluoridation treatment against a rib surface of the dams 512A, 512B made from the polyimide film, so that the surface becomes lyophobic. Due to the fluoridation treatment, the dams 512A, 512B of polyimide have a surface which is lyophobic against the functional ink, while the ITO electrode has a surface which still exhibits excellent wetting property for the functional ink. Since dams 512A, 512B have a lyophobic surface for preventing the functional ink from adhering, the functional ink suffers from a poor wetting property on the rib surface of the dam, so that dams 512A, 512B can effectively block the functional ink and restrict it within the moat 521. A contact angle of the functional ink against the surface of the lyophobic dams 512A, 512B and the moat 521 is preferably at least 10 degrees, and more preferably at least 30 degrees. For example, for a HIL ink commercially available from Nissan Chemical Industries, Ltd., the contact angle against the surface of the dams 512A, 512B of polyimide is about 40 degrees, while the contact angle against the surface of the ITO electrode in the light emitting portion is about 5 degrees or less.

As an example, the dams 512A, 512B are formed from polyimide which is non-lyophobic, and the surface then is subject to a fluoridation treatment to become lyophobic. In this context, the term "lyophobic" refers to a property of repelling a functional ink which is used to form a functional film in a subsequent process. When the material for forming the dam is lyophobic in itself, the step of surface treatment is not necessary. An organic material or an inorganic material can be candidate for form the dam. The organic material suitable for forming the dam comprises, but not limited to, polyimide resin, acrylic resin, and melamine resin. The inorganic material suitable for forming the dam comprises, but not limited to, polysiloxane.

In an embodiment, in the fabricated organic electroluminescence display device, the substrate 505 has a dimension of 470 mm×370 mm×0.7 t. An active area 511 is formed on the substrate 505 to have a diagonal length of 16 inch, an aspect ratio of 4:3, and a resolution of 1024×768 (XGA). The active area 511 has a dimension of 324.608 mm×243.456 mm. The pixel has a dimension of 0.317 mm×0.317 mm, each RGB sub-pixel has a dimension of 0.105667 mm×0.317 mm, and the light emitting region has an elliptical shape with a dimension of 0.070 mm×0.210 mm, as shown in FIGS. 5B and 6.

In the present invention, the dams 512A, 512B can have a width of 50 µm-5000 µm, preferably 100 µm-1000 µm, and more preferably 500 µm. The dams 512A, 512B can have a height of 0.5 µm-50 µm, preferably 1-5 µm, and more preferably 2 Each of the dams 512A, 512B can have the same or different heights and widths. The moat 521 can have a width of 50 µm-5000 µm, preferably 100 µm-1000 µm, and more preferably 500 µm. For example, as shown in FIGS. 5B and 6, the second outer dam 512B with a width of 0.200 mm is arranged to surround the active area 511, and the outermost dam 512A with a width of 0.300 mm is arranged outside the second outer dam 512B. The moat 521 with a width of 0.500 mm is arranged between the outermost dam 512A and the second outer dam 512B.

Then, a die slit coater DSC which is commercially available from TAZMO CO., LTD. is applied to coat a coating type HIL ink (with a solid concentration of 2%) which is available from Nissan Chemical Industries, Ltd., forming a functional film (i.e., HIL) with a thickness of 30 nm.

Figure 7A:
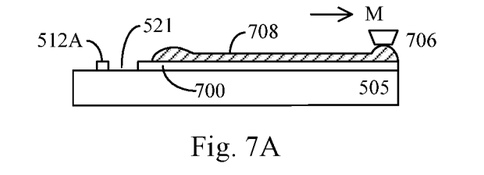
FIGS. 7A, 7B, 7C, 7D, and 7E are schematic cross-sectional views for illustrating spreading of a functional ink during coating process respectively.
Figure 7B:
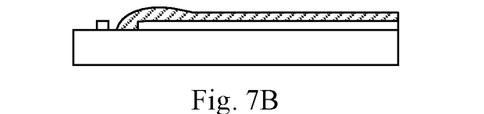
Figure 7C:
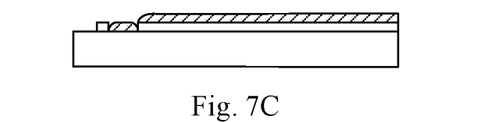
Figure 7D:
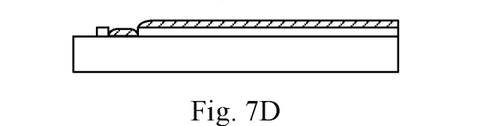
Figure 7E:
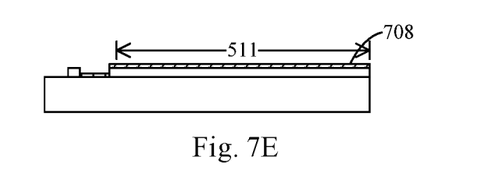

FIGS. 7A-7E are schematic cross-sectional views for illustrating spreading of a functional ink during coating process respectively. In particular, FIGS. 7A-7E are cross-sectional views taken along BB' in FIG. 5B. A coating component 706 like an inkjet printer IJP or a die slit coater DSC advances in a direction M, to coat a functional ink 708 for forming a HIL onto the substrate 505. Related components and layers which have been formed on the substrate 505, such as wirings, insulating films, TFTs, ITO electrodes or the like, are not illustrated in FIGS. 7A-7E for simplicity. Further, only the outermost dam 512A and the moat 521 are shown in FIGS. 7A-7E. FIG. 7A indicates a state in which the coating component 706 is coating the functional ink 708 on the substrate 505, and the reference numeral 700 shows the position at which printing starts. As shown in FIG. 7B, after being coated, the functional ink 708 starts to spread and flow into the moat 521. As shown in FIG. 7C, the outermost dam 512A blocks the functional ink 708 from overflowing outward. As shown in FIG. 7D, in a drying process, the functional ink 708 gradually reduces in thickness, since the solvent contained therein gradually volatilizes. As shown in FIG. 7E, after a sintering process, the functional ink forms a functional film 708 with a uniform thickness within the active area 511.

Figure 8A:
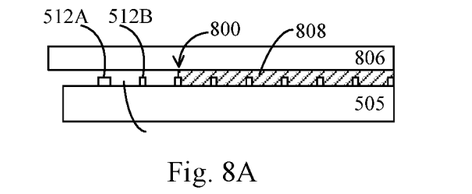
FIGS. 8A, 8B, 8C, 8D, and 8E are schematic cross-sectional views for illustrating spreading of a functional ink which is coated by a die slit coater respectively.
Figure 8B:
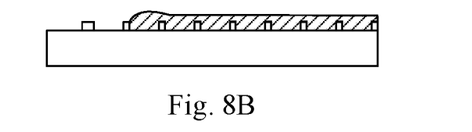
Figure 8C:
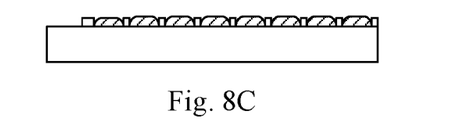
Figure 8D:
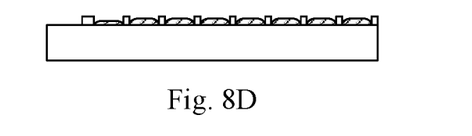
Figure 8E:
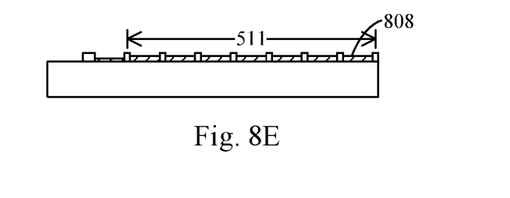

FIGS. 8A-8E are schematic cross-sectional views for illustrating spreading of a functional ink which is coated by a die slit coater DSC respectively. In particular, FIGS. 8A-8E are cross-sectional views taken along AA' in FIG. 5B, i.e., side views as observed from the front of the die slit coater DSC. A coating component 806 like die slit coater DSC is used to coat a functional ink 808 for forming a HIL onto the substrate 505. Similarly, related components and layers which have been formed on the substrate 505, such as wirings, insulating films, TFTs, ITO electrodes or the like, are not illustrated in FIGS. 8A-8E for simplicity. Further, only the outermost dam 512A, the second outer dam 512B, and the moat 521 therebetween are shown in FIGS. 8A-8E. FIG. 8A indicates a state in which the coating component 806 is coating the functional ink 808 on the substrate 505, and the reference numeral 800 indicates the slit end of the die slit coater DSC. As shown in FIG. 8B, after being coated, the functional ink 808 starts to spread, and is blocked by the second outer dam 512B. As shown in FIG. 8C, the functional ink 808 further spreads, potentially across the second outer dam 512B to flow into the moat 521, and is blocked by the outermost dam 512A from overflowing outward. As shown in FIG. 8D, in a drying process, the functional ink 808 gradually reduces in thickness, since the solvent contained therein gradually volatilizes. As shown in FIG. 8E, after a sintering process, the functional ink forms a functional film 808 with a uniform thickness within the active area 511.

In an embodiment in which a die slit coater DSC is used to coat a functional ink, in an advancing direction of the coating component 806 (i.e., the coating direction), a length of a region surrounded by the dams is preferably larger than a coating length of the die slit coater DSC. For example, a distance between the outermost dam 512A shown in FIG. 8A and the outermost dam on the other side (not shown in FIG. 8A) in the coating direction is larger than the coating length of the die slit coater DSC. Here, the coating length refers to a distance by which the die slit coater DSC coats simultaneously in the advancing direction of the coating component 806. In this embodiment, it is possible to effectively prevent the functional ink 808 from directly being coated onto the outermost dam 512A, leaving room for the functional ink 808 to spread.

During coating, the coating component 806 has a slit direction which is generally perpendicular to the advancing direction of the coating component 806, i.e., perpendicular to the coating direction. In another embodiment in which a die slit coater DSC is applied to coat the functional ink, in a direction perpendicular to the advancing direction of the coating component 806, the outermost dam 512A preferably has a length larger than the width of the region to be coated, and larger than the slit width of the coating component 806. In this embodiment, it is possible to effectively prevent the functional ink from directly being coated onto the outermost dam 512A, leaving room for the functional ink 808 to spread.

Figure 9A:
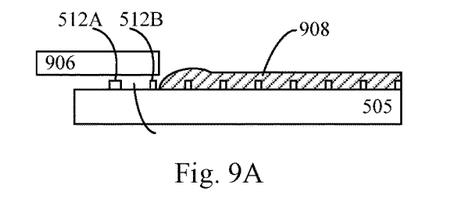
FIGS. 9A, 9B, 9C, 9D, and 9E are schematic cross-sectional views for illustrating spreading of a functional ink which is coated by an electric spray coater respectively.
Figure 9B:
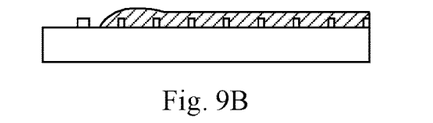
Figure 9C:
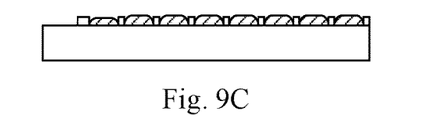
Figure 9D:
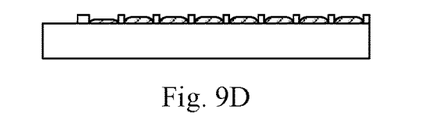
Figure 9E:
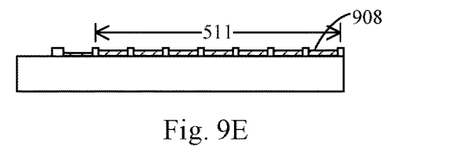

FIGS. 9A-9E are schematic cross-sectional views for illustrating spreading of a functional ink which is coated by an electric spray coater ESC respectively. In particular, FIGS. 9A-9E are cross-sectional views taken along AA' in FIG. 5B, and show the position relationship between the mask and the dam in the electric spray coater ESC. A coating component 906 like the electric spray coater ESC is used to coat a functional ink 908 for forming a HIL onto the substrate 505. More particularly, the coating component 906 in FIGS. 9A-9E indicates the mask used in the electric spray coater ESC. Similarly, related components and layers which have been formed on the substrate 505, such as wirings, insulating films, TFTs, ITO electrodes or the like, are not illustrated in FIGS. 9A-9E for simplicity. Further, the outermost dam 512A, the second outer dam 512B, and the moat 521 therebetween are shown in FIGS. 9A-9E. FIG. 9A indicates a state in which the coating component 906 is coating a functional ink 908 on the substrate 505, and the functional ink 908 is blocked by the second outer dam 512B. As shown in FIG. 9B, the functional ink 908 further spreads, potentially across the second outer dam 512B to flow into the moat 521, and is blocked by the outermost dam 512A from overflowing outward. As shown in FIG. 9C, in a drying process, the functional ink 908 gradually reduces in thickness, since the solvent contained therein gradually volatilizes. As shown in FIG. 9D, as the drying process proceeds, the functional ink 908 further reduces in thickness. As shown in FIG. 9E, after a sintering process, the functional ink forms a functional film 908 with a uniform thickness within the active area 511.

In an embodiment in which an electric spray coater ESC is applied to coat a functional ink, in a projection along a direction perpendicular to the substrate 505, the dams 512A, 512B preferably have a length and width which are both larger than a length and width of an opening in the mask of the electric spray coater ESC. In this embodiment, it is possible to effectively coat the functional ink coat on the region to be coated which is surrounded by the dam through the mask of the electric spray coater ESC.

In the above embodiments of the present invention, a HIL with a uniform thickness can be formed in a sub-pixel, thus facilitating to form films with uniform thicknesses in subsequent processes, so that each film in the sub-pixel has a uniform thickness. As a result, the sub-pixel emits light uniformly, thus expanding the light emitting region of the sub-pixel.

In case a die slit coater DSC is applied to coat a functional film, the slit of the die has a width of e.g., 243.000 mm, and is arranged to parallel with a short side (with a length of 243.456 mm) of the active area 511. The center of the die is aligned with the center of the active area 511. In addition, a position to start coating is located at a position in the active area 511 which is away from an edge of the active area by 0.300 mm, and a position to stop coating is also located at a position in the active area which is away from an edge of the active area by 0.300 mm.

The interval for printing is 0.03 mm, and the speed for printing is 30 mm/sec.

After the HIL ink has been coated, it is subject to pre-drying for 5 minutes on a hot plate at 80° C., then subject to sintering for 20 minutes in an atmospheric environment at 230° C., and finally is cooled. The duration from printing to pre-drying is about 30 seconds. The spreading condition of the HIL ink has been observed, and it is confirmed that the functional ink does not flow across the outermost dam 512A and spread outward.

After the HIL 708, 808, 908 is formed, a HTL, a white light emitting layer, an electron injection layer (EIL), and a transparent electrode are formed by evaporation, and AN-100 glass pate with a RGB color filter is applied as a cover glass plate for encapsulation.

In this way, a plurality of 16-inch XGA organic electroluminescence display devices is fabricated. Once assembled, the organic electroluminescence display devices exhibit a uniform and excellent display effect during light emitting. In addition, the functional ink does not flow to electrode contact holes 531 outside the active area 511, and it is confirmed that all organic electroluminescence display devices have been lighted.

Reference is further made to FIGS. 5A and 5B. Since the dam 512A is provided in the present invention, which effectively prevents the coated functional ink from spreading outside, the actual consumption of the functional ink during coating is less than the average consumption which is calculated on basis of the coating area.

In a preferred embodiment of the present invention, the dams 512A, 512B can be lyophobic in themselves, or can become lyophobic via a surface treatment. The lyophobic dams 512A, 512B can further prevent the coated functional ink from spreading outside, thus decreasing consumption of the functional ink during coating.

In a preferred embodiment of the present invention, the moat 521 can be made from a lyophobic material, or is subject to a surface treatment to be lyophobic. For example, in case the dams 512A, 512B are made from polyimide, the polyimide material between dams 512A, 512B can be partially retained, thus forming the moat 521 which is recessed with respect to the dams. In subsequent processes, the dams 512A, 512B and the moat 521 are simultaneously subject to a surface treatment to be lyophobic. The lyophobic moat 521 can further prevent the coated functional ink from spreading outside, thereby decreasing consumption of the functional ink during coating.

In a preferred embodiment of the present invention, at least one of the dams is continuous and closed. For example, the outermost dam 512A is continuous and closed, so as to effectively block the functional ink from spreading outside during coating. More preferably, a second outer dam or an inner dam can also be closed.

In a preferred embodiment of the present invention, as observed from the active area 511, the dams 512A, 512B have a corner portion which can be right-angled, polygon-shaped, R-shaped, or arc-shaped, so as to prevent the functional ink from spreading outside during coating.

In the foregoing description, the present inventive concept has been explained by taking forming a hole injection layer in an organic electroluminescence display device as an example. However, it is appreciated by the skilled in the art that the present invention is not limited thereto. For example, the present inventive concept can be applied to form other organic functional films in an organic electroluminescence display device, and form an alignment film e.g. of polyimide on a color film substrate in a liquid crystal display device.

Although the present invention has been described above with reference to specific embodiments, it should be understood that the limitations of the described embodiments are merely for illustrative purpose and by no means limiting. Instead, the scope of the disclosure is defined by the appended claims rather than by the description, and all variations that fall within the range of the claims are intended to be embraced therein. Thus, other embodiments than the specific ones described above are equally possible within the scope of these appended claims.

What is claimed is:

1. A method for fabricating a display device, wherein during forming a functional film in the display device, the method comprising steps of:
   forming one or more dams on a substrate which surround a region to be coated;
   coating a functional ink in the region to be coated with a die slit coater; and
   forming the functional ink into a functional film,
   wherein a length of a region surrounded by the dams in a coating direction is larger than a coating length of the die slit coater, or
   wherein in a direction perpendicular to the coating direction, a length of the outermost dam is larger than a width of the region to be coated and larger than a width of the slit of the die slit coater.

2. The method of claim 1, wherein the step of forming the functional ink into the functional film is by drying and sintering.

3. The method of claim 1, wherein the dams have a height of 0.5 μm-50 μm or 1-10 μm, and have a width of 50 μm-5000 μm or 100 μm-1000 μm.

4. The method of claim 1, wherein the dams have a height of 2 μm and a width of 500 μm.

5. The method of claim 1, wherein at least one of the dams is continuous and closed.

6. The method of claim 1, wherein the dams are formed from polyimide resin, acrylic resin, melamine resin, or polysiloxane.

7. The method of claim 1, wherein as observed from the active area, the dams have a corner portion which is right-angled, polygon-shaped, R-shaped, or arc-shaped.

8. The method of claim 1, further comprising: forming a moat between the dams or between an outermost dam and the region to be coated.

9. The method of claim 8, further comprising: treating the surface of the dams and the moat to be lyophobic.

10. The method of claim 8, wherein the moat has a width of 50 μm-5000 μm.

11. The method of claim 8, wherein a contact angle of the functional ink against the surface of the dams and the moat is at least 10 degrees, or at least 30 degrees.

\* \* \* \* \*